United States Patent
Schuster et al.

(10) Patent No.: US 12,424,504 B2
(45) Date of Patent: Sep. 23, 2025

(54) COMPONENT EMBEDDED IN COMPONENT CARRIER AND HAVING AN EXPOSED SIDE WALL

(71) Applicant: AT&SAustria Technologie & Systemtechnik AG, Leoben (AT)

(72) Inventors: Bettina Schuster, Leoben (AT); Jonathan Silvano de Sousa, Vienna (AT); Andreas Zluc, Leoben (AT); Markus Leitgeb, Trofaiach (AT); Hannes Stahr, St. Lorenzen im Muerztal (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 212 days.

(21) Appl. No.: 18/147,276

(22) Filed: Dec. 28, 2022

(65) Prior Publication Data

US 2023/0135105 A1 May 4, 2023

Related U.S. Application Data

(63) Continuation-in-part of application No. 16/051,618, filed on Aug. 1, 2018, now Pat. No. 11,570,897.

(51) Int. Cl.
*H05K 1/18* (2006.01)
*G02B 6/42* (2006.01)
(Continued)

(52) U.S. Cl.
CPC ........ *H01L 23/3157* (2013.01); *G02B 6/4206* (2013.01); *H01L 21/56* (2013.01);
(Continued)

(58) Field of Classification Search
CPC ...... H05K 1/188; H05K 1/185; H05K 3/0044; H05K 3/4658; H05K 3/4694; H05K 3/4697
See application file for complete search history.

(56) References Cited

U.S. PATENT DOCUMENTS

| | | | |
|---|---|---|---|
| 8,606,057 B1 * | 12/2013 | Rudmann | H01L 31/0203 385/14 |
| 9,482,882 B1 | 11/2016 | Hanover et al. | |

(Continued)

FOREIGN PATENT DOCUMENTS

| | | |
|---|---|---|
| EP | 2595462 A2 | 5/2013 |
| JP | H08191186 A | 7/1996 |

(Continued)

OTHER PUBLICATIONS

Geoghegan, C.; Communication Pursuant to Article 94(3) EPC in Application No. 17 185 037.3; pp. 1-8; Feburary 5, 2021; European Patent Office; Postbus 5818, 2280 HV Rijswijk, Netherlands.
(Continued)

*Primary Examiner* — Imani N Hayman
*Assistant Examiner* — Hung Q Dang
(74) *Attorney, Agent, or Firm* — Robert A. Blaha; Smith Tempel Blaha LLC

(57) ABSTRACT

A method for manufacturing a component carrier includes i) providing a metal layer, in particular a copper layer; ii) forming a film on the metal layer; iii) patterning the film in order to expose a part of the metal layer; iv) carrying out a first etch, thereby thinning the film and removing a further part of the exposed metal layer; and thereafter v) carrying out a second etch, thereby forming at least one metal trace that is spatially separated from the metal layer. A component carrier made by the method is further described.

19 Claims, 6 Drawing Sheets

(51) Int. Cl.
    *H01L 21/56*     (2006.01)
    *H01L 23/31*     (2006.01)
    *H05K 3/00*     (2006.01)
    *H10F 77/50*     (2025.01)
    *H10H 20/85*     (2025.01)

(52) U.S. Cl.
    CPC ........... *H05K 1/186* (2013.01); *H05K 3/0044* (2013.01); *H10F 77/50* (2025.01); *H10H 20/8506* (2025.01)

(56) References Cited

U.S. PATENT DOCUMENTS

| | | | |
|---|---|---|---|
| 2012/0104104 A1* | 5/2012 | Hofmann | H05K 1/183 235/492 |
| 2013/0083003 A1 | 4/2013 | Perez et al. | |
| 2013/0265478 A1* | 10/2013 | Reichel | G02B 9/04 348/340 |
| 2013/0278631 A1 | 10/2013 | Border et al. | |

FOREIGN PATENT DOCUMENTS

| | | | |
|---|---|---|---|
| JP | P2007-208294 A | 8/2007 | |
| WO | 2005039259 A1 | 4/2005 | |
| WO | 2015149097 A1 | 10/2015 | |
| WO | 2017114917 A1 | 7/2017 | |
| WO | 2018129156 A1 | 7/2018 | |

OTHER PUBLICATIONS

Notification of Second Office Action in Application No. 201810878356.3; pp. 1-6, Aug. 25, 2021; The China National Intellectual Property Administration; No. 6, Xitucheng Lu, Jimenqiao Haidan District, Beijing, 100088, China.

English Translation of Cover Page of Notification of Second Office Action in Application No. 201810878356.3; pp. 1-3, Aug. 25, 2021; The China National Intellectual Property Administration; No. 6, Xitucheng Lu, Jimenqiao Haidan District, Beijing, 100088, China.

Geoghegan, C.; Communication Pursuant to Article 94(3) EPC in Application No. 17 185 037.3; pp. 1-8; Jun. 8, 2022; European Patent Office; Postbus 5818, 2280 HV Rijswijk, Netherlands.

First Office Action in Application No. 202210511238.5; pp. 1-7; Feb. 6, 2024; China National Intellectual Property Administration; No. 6, Xitucheng Lu, Jimenqiao Haidian District, Beijing City, 100088; China.

* cited by examiner

COMPONENT EMBEDDED IN COMPONENT CARRIER AND HAVING AN EXPOSED SIDE WALL

CROSS-REFERENCE TO RELATED APPLICATIONS

This application is a continuation-in-part of U.S. patent application Ser. No. 16/051,618 and claims in part the benefit of the filing date of European Patent Application No. 17185037.3, filed on Aug. 4, 2017, the disclosures of which are hereby incorporated herein by reference.

TECHNICAL FIELD

Embodiments of the invention relate to a method of manufacturing a component carrier, and to a component carrier.

BACKGROUND ART

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions. Moreover, an extended functionality of component carriers with embedded component is demanded by users.

SUMMARY

There may be a need to integrate a component in a component carrier in a way to allow for an efficient and reliable operation while enabling a high degree of functionality.

To address this need and perhaps other needs, a method of manufacturing a component carrier, and a component carrier according to the independent claims are provided.

According to an exemplary embodiment there is provided a component carrier which comprises (i) a stack comprising a plurality of electrically conductive layer structures and/or electrically insulating layer structures and (ii) an optical component embedded in the stack. At least a portion of a side wall of the optical component is exposed.

According to an exemplary embodiment there is provided a method of manufacturing a component carrier, wherein the method comprises (i) forming a stack of a plurality of electrically conductive layer structures and/or electrically insulating layer structures; (ii) embedding an optical component in the stack; and (iii) subsequently removing material of the stack to thereby expose at least a portion of a side wall of the optical component with regard to an environment of the component carrier.

According to another exemplary embodiment, a component carrier is provided which comprises a stack comprising a plurality of electrically conductive layer structures and/or electrically insulating layer structures, and a component embedded in the stack, wherein at least a portion of a side wall of the component is exposed (for instance with regard to an environment of the component carrier).

According to another exemplary embodiment, a method of manufacturing a component carrier is provided, wherein the method comprises forming a stack of a plurality of electrically conductive layer structures and/or electrically insulating layer structures, embedding a component in the stack, and subsequently removing material of the stack to thereby expose at least a portion of a side wall of the component.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "embedded component" may particularly denote any body or member not in the shape of and having a lower dimension than the layer structures of the layer stack and being nevertheless accommodated in an interior of component carrier material (i.e., stack material, for instance resin with reinforcing particles as dielectric material and copper as electrically conductive material). The accommodation of the component in the component carrier material may be accomplished by lamination, i.e., the application of pressure and/or heat for integrally connecting the constituents of the component carrier.

In the context of the present application, the term "exposed side wall" may particularly denote a lateral side wall portion of the component embedded in component carrier material, which lateral side wall portion is not covered by component carrier material, in particular is not covered at all with solid material. Thereby, an exposed side wall of the component may form part of an exposed surface of the component carrier as a whole. When the component carrier is shaped as a plate with two opposing main surfaces and a circumferential edge, the side wall may form part of or may be substantially parallel to the circumferential edge and may be perpendicular to the main surfaces of the component carrier.

According to an exemplary embodiment, the component carrier further comprises an access recess formed in the stack, wherein the access recess extends from a lateral side wall of the stack to the side wall of the optical component and the access recess exposes the side wall of the optical component.

According to an exemplary embodiment, the access recess is configured as a blind hole.

According to an exemplary embodiment, the component carrier further comprises a further component being inserted in the access recess.

According to an exemplary embodiment, the further component is an optically transparent component.

According to an exemplary embodiment, the further component is configured as at least one of (i) a light guide and (ii) an optical fiber.

According to an exemplary embodiment, the further component is configured as at least one of (i) a light detecting element and (ii) a light emitting element.

According to an exemplary embodiment, the further component comprises at least one reflecting surface which is configured to diverge a light beam.

According to an exemplary embodiment, the light beam is emitted from the optical component.

According to an exemplary embodiment, the further component comprises at least one optical lens which is configured to change a focus of a light beam.

According to an exemplary embodiment, the light beam is emitted from the optical component.

According to an exemplary embodiment, the access recess is a slit-shaped recess exposing a first side wall of the optical component and a second side wall of a further component. Further, (i) the first side wall and the second side wall oppose each other, (ii) the optical component and the further component are arranged opposite to each other, and (iii) the optical component and the further component are communicatively coupled for a wireless data communication via the slit-shaped access.

According to an exemplary embodiment, the slit-shaped access is an air gap.

According to an exemplary embodiment, the optical component and the further component are embedded in the stack.

According to an exemplary embodiment, the component carrier further comprises a transparent material being arranged between the side wall of the optical component and a lateral side wall of the stack.

According to an exemplary embodiment, the transparent material forms part of an optical path for propagating electromagnetic radiation.

According to an exemplary embodiment, the transparent material comprises at least one of (i) a fiber free material, (ii) glass, and (iii) epoxy.

According to an exemplary embodiment the transparent material comprises at least one of (i) at least one reflecting surface which is configured to diverge a light beam, and (ii) at least one optical lens which is configured to change a focus of a light beam.

According to an exemplary embodiment of the method, removing material of the stack comprises forming an access recess in the stack, wherein the access recess extends from a lateral side wall of the stack to the side wall of the optical component and the access recess exposes the side wall of the optical component with regard to the environment of the component carrier.

According to an exemplary embodiment of the method, removing material of the stack further comprises performing a cutting procedure of the stack.

According to an exemplary embodiment of the method, the optical component is at least in part circumferentially covered by a transparent material.

According to an exemplary embodiment of the method, removing material of the stack further comprises, after performing the cutting procedure, performing a lateral polishing procedure which smoothes a side wall surface of the transparent material.

In the following, further exemplary embodiments of the component carrier and of the method of manufacturing a component carrier are described.

According to an exemplary embodiment, a component carrier with an embedded component is provided which is exposed laterally, i.e., at its side wall. This can be accomplished in a highly accurate way by removing material of a stack of connected layer structures in which the component is embedded after the embedding procedure is completed to thereby expose the lateral side surface. But taking this measure, it becomes possible to functionally use a side wall of a component for establishing a connection or coupling with an environment, for instance for sensor or optoelectronic applications. The upper and lower main surfaces of the stack and hence of the component carrier may thereby remain available for mounting further components, etc. The described architecture thereby renders it possible to keep component carriers compact without compromising on the functionality thereof. In contrast to this, a lateral side surface of the component carrier may be made available as a functional part of the component.

In the following, further exemplary embodiments of the method and the component carrier will be explained.

In an embodiment, the exposed side wall and a side wall of the stack are aligned to form a substantially continuous (for instance substantially vertical) side wall of the component carrier. In other words, it is possible that the exposed side wall of the component and the side wall of the stack are aligned with one another or are in flush with one another. This prevents undercuts at the side wall of the component carrier in which contaminants such as dust may accumulate.

In another embodiment, an access recess exposing the side wall extends laterally from a lateral side wall of the stack up to the lateral side wall of the component. In such an embodiment, it is possible to space the exposed side wall of the component with regard to the side wall of the component carrier. Such an architecture may for instance be advantageous when a mechanical, an optical, an electrical or an electro-optical coupling of the exposed component with a periphery shall be established via an electric or optical cable. For instance, an electric lead or an optical fiber may be inserted into the access recess so as to establish an electric, optical and/or electro-optical coupling.

In another embodiment, an access recess exposing the side wall extends from one of two opposing main surfaces of the stack up to the component. In other words, the access recess may be formed as a (blind or through) hole which may extend from one of the two opposing main surfaces at least up to the embedded component or even up to the other main surface. In such an embodiment, the embedded component remains securely mechanically protected in the interior of the stack while nevertheless being functionally coupled to an exterior environment of the component carrier. For instance, such an embodiment may be used for a gas, chemical or moisture sensor having its sensitive surface at the exposed side wall of the component.

In an embodiment, the access recess is a slit extending into a central portion of the stack. Preferably, the slit has a length being larger than a width. For instance, the length may be at least twice the distance of the width. Such a slit may have a length being significantly longer than (in particular at least five times of) than a width. The longer extension direction of the slit may correspond to a horizontal extension direction of the side wall of the component, whereas the short extension direction may extend perpendicular to the side wall of the component. Such a slit may be simply formed by drilling, milling, or laser cutting perpendicular to a main surface of the component carrier.

In an embodiment, the access recess is configured as one of the group consisting of a through-hole extending through the entire stack, and a blind hole.

In an embodiment, only one main surface of the, in particular substantially cuboid, component is exposed. In other words, five main surfaces of the substantially cuboid component may remain covered by component carrier material of the component carrier and may thus be properly mechanically protected. The, in this case only, one side wall being exposed may then allow precisely defining the interface properties between the component and the environment.

In an embodiment, the component is arranged laterally asymmetrically in an accommodation cavity of the stack, in particular with different distances with regard to opposing accommodation cavity delimiting side walls of the stack. This has the advantage that the side of the cavity with the smaller distance to the component serves for securely defining the position of the component in the component carrier (for instance by constituting a lateral abutment surface for the component), wherein the other side wall of the cavity with the larger distance to the component allows exposing the side wall of the component even by processing with relatively low spatial accuracy. In other words, the larger distance value corresponds to a tolerance allowed when exposing the side wall of the component by cutting through the larger distance.

In an embodiment, the component comprises a sensor configured for sensing sensor information via the exposed surface. In other words, the exposed surface may comprise at least a sensitive portion for detecting a medium to be sensed. Such a medium may be electricity, electromagnetic radiation (in particular optical light), or a substance (such as a gas, a liquid, or any other chemical). Thus, exposing the lateral side wall or surface of the component allows manufacturing a component carrier with integrated sensor functionality in a compact way.

In an embodiment, the component comprises an electromagnetic radiation source configured for emitting electromagnetic radiation via the exposed surface. In such an embodiment, the component carrier may be capable of generating electromagnetic radiation transmitted via the exposed surface towards an environment or a communication partner device (for instance a receiver). For example, the component may be a laser diode or any other light source.

In an embodiment, the component carrier comprises a further component embedded in the stack, wherein the component and the further component are communicatively coupled, in particular at least partially via the access recess. For instance, the further component may be coupled to the previously mentioned component via the access recess. For example, one of the component and the further component may be a sender (for instance a light sender) and the other one of the component and the further component may be a receiver (for instance a light receiver).

In an embodiment, the component and the further component are configured as a pair of an electromagnetic radiation emitter (for instance capable of generating electromagnetic radiation in the visible, infrared and/or UV range) and an electromagnetic radiation detector (for instance capable of sensing electromagnetic radiation in the visible, infrared and/or UV range), a pair of a light guide (such as a light fiber) and a light emitter (such as a laser diode), or a pair of a light guide (such as a light fiber) and a light detector (such as a photodiode).

In an embodiment, at least one of the electrically insulating layer structures being in direct contact with or being neighbored to the embedded component (in particular being arranged directly above and/or directly below the component) is made of low-flow prepreg or no-flow prepreg. However, FR4 material may also be used. Advantageously, no-flow prepreg or low-flow prepreg will not or substantially not re-melt/not become flowable during lamination, so that a hole next to the component will not be closed during laminating by liquefied resin or the like and the side wall to be exposed can be kept free of resin material. When laminating a corresponding stack by applying mechanical pressure and/or heat, the material of the low-flow prepreg or no-flow prepreg is advantageously prevented from flowing into a hollow space between component and layer stack. By subsequently exposing the side wall of the component by removing (for instance cutting) a portion of the stack adjacent to the hollow space, it is possible to complete formation of the component carrier with embedded component having an exposed side wall. This procedure simplifies exposing the side wall of the component, for instance by milling.

In an embodiment, embedding the component in the stack comprises arranging the component in direct contact with a plurality of electrically conductive layer structures and/or electrically isolation layer structures such that at least five surfaces of the component are covered by the stack. Thereby, an orientation of the component with the stack can be made more precise and/or a sensitivity of the component with respect to external impacts can be decreased.

In an embodiment, embedding the component in the stack comprises forming an accommodation cavity (i.e., a hollow space for mounting the component) in at least one of the layer structures of the stack and placing the component in the accommodation cavity. The latter mentioned placement may be made asymmetrically in a lateral direction so that two opposing gaps between component and respective side walls of the stack have different sizes. The accommodation cavity may be formed, for example, by using a pre-cut core, by mechanically drilling or laser drilling, or by applying the concept of release layers. Such a release layer may be a layer (for instance made of a waxy material) on which other component carrier material of the stack does not properly adhere. Cutting a circumferentially closed hole above such a release layer may therefore allow removal of a piece of the stack above the release layer to thereby complete formation of the cavity.

In an embodiment, the component is placed in the accommodation cavity so that a size of a gap between a side wall of the component and an accommodation cavity delimiting side wall of the stack is different from a further size of a further gap between an opposing further side wall of the component and an opposing further accommodation cavity delimiting side wall of the stack. At a side wall of the component which shall not be exposed after embedding, the size of the gap shall be as small as possible so as to precisely define the position of the component in the component carrier. In contrast to this, at an opposing other side wall of the component which shall be exposed later the dimension of the gap may be advantageously larger so that the accuracy of removing material for exposing the component on the corresponding side thereof need not be very high. This relaxes the requirements of spatial accuracy during stack material removal in terms of exposing the side wall.

In an embodiment, the method further comprises filling at least part of a gap between the component and an accommodation cavity delimiting side wall of the stack with a removable sacrificial material, and at least partially removing the sacrificial material after completion of the embedding, in particular to thereby expose the side wall. In this context, the term "sacrificial material" may particularly denote an auxiliary material which is provided only for temporary use and which shall later be intentionally removed so that it does not form part of the final product, i.e., component carrier. In the present embodiment, the sacrificial material is provided for preventing the component from migrating within the cavity, because a free gap of the cavity may be filled with the sacrificial material. The sacrificial material may temporarily cover the side wall to be exposed later, but may be easily removable from this side wall. The sacrificial material may thus have the property of being easily removable selectively with regard to the component material so that the sacrificial material can be later removed for exposing the side wall of the component without harming the component and without the need to apply a complex removal procedure.

In an embodiment, the method further comprises inserting the component in a first part of the accommodation cavity, and subsequently filling the sacrificial material into at least part of a remaining second part (as the gap) of the accommodation cavity laterally juxtaposed to the first part. Thus, the component may firstly be placed in the accommodation cavity, and a remaining gap may be filled partially or entirely with the sacrificial material, for instance using a wiper. This embodiment has the advantage that a single cavity formation process is sufficient to provide an accommodation volume for both the sacrificial material and the component.

In an alternative embodiment, the method further comprises forming a first cavity portion (which may later constitute the gap) in the stack and filling the first cavity portion at least partially with the sacrificial material. Subsequently, a second cavity portion may be formed separately in the stack and overlapping with the first cavity portion. In other words, the second cavity portion may be composed of part of the first cavity portion and of an adjacent portion of the stack which is removed. It is then possible to insert the component into the second cavity portion so that the first cavity portion at least partially filled with the sacrificial material and the second cavity portion accommodating the component together constitute the accommodation cavity. Thus, it is possible that a first cavity (or first cavity portion of the accommodation cavity) is formed in the stack and is filled with the sacrificial material, for instance using a wiper. Optionally, the sacrificial material may then be cured. It is then possible to form, thereafter and separately, a second cavity (or second cavity portion of the accommodation cavity) which partially overlaps with the first cavity. In this context, it is also possible to remove a portion of the sacrificial material in the overlapping volume. The component may then be placed in the second cavity. An advantage of such an embodiment is that the process of applying the sacrificial material is simplified and rendered more accurate, since it can be applied in a first cavity portion of relatively large size, and not limited to a small gap between component and side wall of the stack next to the cavity. Another advantage of such an approach is that a potential curing process for curing the sacrificial material may be carried out prior to the insertion of the component, so that the component is not harmed by curing conditions (for instance an elevated temperature).

In an embodiment, the sacrificial material comprises one of the group consisting of a release structure with non-adhesive properties with regard to the material of the stack and the component, an evaporable liquid, a liquid which can be flushed out, and a substance which can be dissolved (for instance by water or an aqueous solution). Such a release structure may for instance be made of a waxy material or may be based on polytetrafluoroethylene. A suitable evaporable liquid is water or alcohol. A liquid which can be flushed out can be substantially any liquid which may be later removed from the gap to thereby expose the side wall by applying pressurized gas, etc.

In an embodiment, the method further comprises providing the component with a removable sacrificial material thereon, in particular a release structure, prior to the embedding, subsequently embedding the component with the removable sacrificial material thereon into the stack, and at least partially removing the sacrificial material after completion of the embedding, in particular to thereby expose the side wall. Thus, it is also possible to apply a release layer or another sacrificial material directly on the component before initiating the embedding procedure. This renders it dispensable to apply a sacrificial material in a tiny gap.

In an embodiment, removing the material of the stack comprises at least one of a group consisting of milling and laser cutting. For instance, an edge section of the component carrier may be removed by milling or laser cutting to thereby expose the side wall of the component.

In an embodiment, a size of a lateral gap between the component and an accommodation cavity delimiting side wall of the stack is at least 50 µm, in particular at least 300 µm, more particularly at least 500 µm. For instance, the size of the lateral gap may be in a range between 5 µm and 500 µm. This allows carrying out the material removing procedure with low accuracy requirements.

In an embodiment, embedding the component comprises laminating the component with the stack so that at least partially uncured material of the layer structures is cured. Curing may for instance be established by pressurising and heating curable resin which thereby starts cross linking. During the curing, the resin temporarily melts, flows into tiny gaps, re-solidifies, and thereby interconnects the various constituents of the component carrier. Thereby, a mutual integral connection between the stack and the component can be ensured, and consequently a high mechanical integrity of the component carrier as a whole.

In an embodiment, forming the stack comprises attaching a temporary carrier to the layer structures when the latter are still in a condition to comprise at least partially uncured material. In an embodiment, the temporary carrier comprises a sticky surface facing the component carrier material and the recess or cavity. Providing the temporary carrier with a sticky surface simplifies connection of the temporary carrier on the component carrier material, in particular a core having a through-hole, closed by the temporary carrier. In an embodiment, the temporary carrier comprises a rigid plate. It is advantageous that the temporary carrier has a rigid plate providing the semifinished product still including the temporary carrier with additional stability during a lamination procedure by which further layers are built up. However, as an alternative to a rigid plate (preferably having a sticky upper surface), it is also possible that the temporary carrier is a sticky foil or tape being flexible.

In an embodiment, it is possible to remove the temporary carrier from the stack after curing the at least partially uncured material of the layer structures. Since after curing, the previously uncured material has been cured and hardened, the provision of mechanical support by the temporary carrier may be dispensable after completion of the lamination and curing procedure. For instance, the temporary carrier may be simply peeled off from the semifinished product after lamination.

In an embodiment, the component comprises an electromagnetic radiation emitting member (such as a light-emitting diode) configured for emitting electromagnetic radiation (such as visible light), more specifically via a side surface thereof, and being at least partially covered by an optically transparent (in particular transparent in the visible range) material at least partially forming the exposed side wall and being transparent for the electromagnetic radiation emitted by the electromagnetic radiation emitter member. The transparent material may for instance encapsulate the electromagnetic radiation emitter member and may therefore simultaneously protect the latter while at the same time enabling propagation of electromagnetic radiation through the transparent material out of the component carrier via a side wall thereof. Preferably, the transparent material may be a resin (being properly compatible with other component carrier material of the stack) being free of fibers (which might deteriorate the undisturbed propagation of the electromagnetic radiation) or the like.

In an embodiment, at least part of the transparent material at least partially forming the exposed side wall is polished. Polishing the exposed sidewall of the transparent material to decrease roughness thereof has the particular advantage that undesired diffraction processes at the transition area between transparent material and surrounding of the component carrier can be strongly suppressed. Such a scattering may unintentionally and undesirably increase a cross-sectional area of the propagating beam of electromagnetic radiation, which may involve losses. However, diffraction may be suppressed by polishing the planar exposed sidewall, and a substantially parallel light beam may propagate out of the component carrier with reduced losses.

The mentioned component, and optionally at least one further component to be surface mounted on or embedded in the component carrier, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna structure, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite coupling structure) or may be a paramagnetic element. However, the component may also be a further component carrier, for example in a board-in-board configuration. The component may be surface mounted on the component carrier and/or may be embedded in an interior thereof. Moreover, also other components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e., planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene, a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene (PTFE), liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

In an embodiment, the component carrier is a laminate-type body. In such an embodiment, the component carrier is a compound of multiple layer structures which are stacked and connected together by applying a pressing force, if desired accompanied by heat.

DETAILED DESCRIPTION OF ILLUSTRATED EMBODIMENTS

Figure 1:
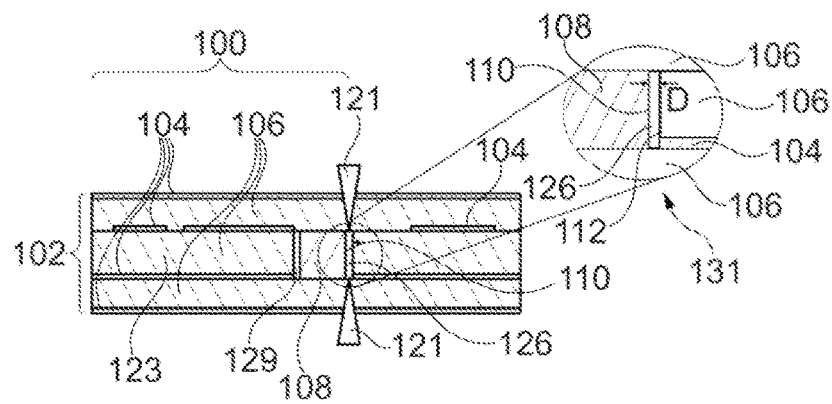
FIG. 1, FIG. 2, and FIG. 3 illustrate cross-sectional views of pre-forms of component carriers manufactured according to exemplary embodiments.

Embodiments of the component carrier can be better understood with reference to the following drawings. The elements and features in the drawings are not necessarily to scale, emphasis instead being placed upon clearly illustrating the structures and principles of operation of the assemblies.

The illustrations in the drawings are schematically presented. In different drawings, similar or identical elements are provided with the same reference signs.

The aspects defined above and further aspects of the invention are apparent from the examples of embodiment to be described hereinafter and are explained with reference to these examples of embodiment.

Before, referring to the drawings, exemplary embodiments will be described in further detail, some basic considerations will be summarized based on which exemplary embodiments of the invention have been developed.

According to an exemplary embodiment, a component carrier with an embedded component having a lateral opening is provided. Exposing the component on one side has the advantage that new opportunities for embedding are made possible. For instance, plug in connections as well as optical connections can be accomplished in this way. Thus, it becomes possible to expose embedded components from a component carrier with high spatial accuracy at the side wall of the component.

A gist of an exemplary embodiment is that an embedded component can be exposed at a flange face thereof with high positional accuracy. Advantageously, the manufacturing method may be configured so that the components to be exposed at a side surface thereof shall preferably not be covered with resin there. In one embodiment, it may be ensured that the side wall surface of the embedded component remains free of any material. This may be for instance accomplished by using channels or hollow spaces around the embedded component using no-flow prepreg or low-flow prepreg for lamination. In another embodiment, the side wall may be temporarily covered with sacrificial material of such a kind that it can be selectively and easily removed later by carrying out simple technical methods. For instance, a release material paste may be arranged next to the component which fixes the component in place at a desired position. However, the material of the release material paste may be easily removed (for instance by stripping) after having removed material of the stack of electrically conductive layer structures and/or electrically insulating layer structures for exposing the side wall. All these concepts have in common that they allow an exposure of a side wall of a component embedded in component carrier material with high precision. Such a manufacturing architecture increases the flexibility of designing component carrier type modules with improved functionality.

FIG. 1 illustrates a cross-sectional view of a pre-form of a component carrier 100, which is here embodied as a printed circuit board (PCB), manufactured according to an exemplary embodiment.

The plate-shaped laminate-type component carrier 100 which can be separated from the structure of FIG. 1 comprises a laminated stack 102 of component carrier material comprising a plurality of electrically conductive layer structures 104 (here embodied as patterned metal foils and metal vias, both preferably made of copper) and a plurality of electrically insulating layer structures 106 (here embodied as resin layers, in particular epoxy based resin layers, with reinforcing fibers, in particular glass fibers, for example prepreg).

Moreover, the component carrier 100 comprises an electronic component 108, which may for instance be a semiconductor chip. The electronic component 108 may be electrically coupled with an electronic environment via the electrically conductive layer structures 104. The component 108 is embedded in the component carrier material of the stack 102. According to FIG. 1, a side wall 110 of the component 108 is still surrounded by material of the stack 102. However, a milling tool 121 is shown in FIG. 1 which is currently in the process of removing material of the stack 102 on the right-hand side of the milling tool 121 from remaining material of the stack 102 on the left-hand side of the milling tool 121. As a result of this milling procedure, a component carrier 100 is obtained having an embedded component 108 with an exposed side wall 110. More specifically, the side wall 110 of the component 108 is exposed with regard to an environment of the component carrier 100 after separation by milling, so that the side wall 110 then forms part of an exterior lateral side wall of the component carrier 100.

The component carrier 100 manufactured according to FIG. 1 can be obtained by firstly cutting cavities (see reference numeral 122 in FIG. 4) in a core 123 (i.e., fully cured resin material of the electrically insulating layer structures 106) as accommodation volumes for components 108. As can be taken from a detail 131 in FIG. 1, the dimension of the cavities may be selected so that a gap 126 (between side wall 110 of component 108 and accommodation cavity delimiting side wall 112 of stack 102) having a dimension, D, of for instance 500 µm thickness remains after placing the components 108 in the cavities on the right-hand side according to FIG. 1. In contrast to this, a further gap 129 on the opposing other side of the component 108, i.e., on the left-hand side according to FIG. 1, may have a significantly smaller dimension of, for instance, 75 µm. This increases the accuracy of the positional placement of the component 108 in the component carrier 100. Thereafter, a temporary carrier (for instance a sticky tape) may be placed on a bottom surface of the core 123 for closing the cavities at a bottom side. Thereafter, the components 108 are fixed in the cavities and on the temporary carrier. A dielectric layer on top of the component 108 as well as on top of the core 123 may then be laminated from an upper side. The said dielectric layer may be made preferably of no-flow prepreg or low-flow prepreg in order to prevent filling of the mentioned gaps 126, 129 during lamination by prepreg material melting during lamination and flowing into the respective gap 126, 129. Such a flow of resin is disabled or at least strongly suppressed when using no-flow prepreg or low-flow prepreg above and below gaps 126, 129. This prevention of flow of resin material in particular into the gap 126 strongly simplifies subsequent exposure of the side wall 110 of the component 108 by milling. Since the gap 126 remains free of resin, the side wall 110 of the component 108 is free of resin after the exposing procedure.

Figure 2:
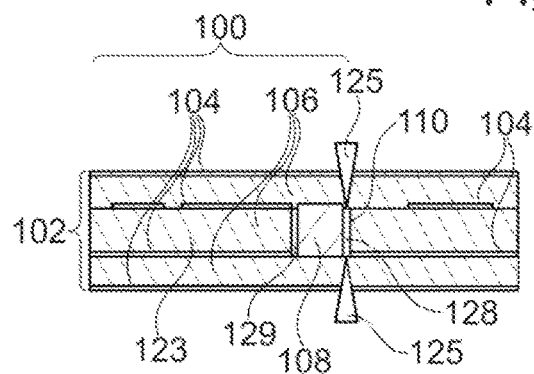

FIG. 2 illustrates a cross-sectional view of a pre-form of a component carrier 100 manufactured according to another exemplary embodiment.

The embodiment of FIG. 2 differs from the embodiment of FIG. 1 in that the removal of material of the stack 102 for exposing side wall 110 of embedded component 108 of component carrier 100 is carried out by laser cutting rather than by milling. Furthermore, the embodiment of FIG. 2 differs from the embodiment of FIG. 1 in that the mentioned gap 126 is filled with a release material paste, as sacrificial material 128, according to FIG. 2. The release material paste may be made of a waxy material or may be formed based on polytetrafluoroethylene (PTFE). After separating the component carrier 100 from the electrically conductive layer structures 104 as well as the electrically insulating layer structures 106 on the right-hand side of schematically illustrated laser cutting tool 125, the sacrificial material 128 embodied as release material paste may be easily removed due to its poor adhesion to component carrier material and to the component 108. Thereafter, the side wall 110 of the component 108 is exposed from sacrificial material 128 and then forms part of a lateral side surface of the component carrier 100.

More specifically, the component carrier 100 manufactured according to FIG. 2 can be obtained by firstly cutting cavities in core 123 as accommodation volumes for components 108. The dimension of the cavities may be selected so that gap 126 having a dimension of for instance 100 µm thickness remains after placing the components 108 in the cavities on the right-hand side according to FIG. 2. Thereafter, a temporary carrier (for instance a sticky tape) may be placed on a bottom surface of the core 123 for closing the cavities from a bottom side. Thereafter, the components 108 are fixed in the cavities and on the temporary carrier. The sacrificial material 128 in form of the release material paste may then be inserted into the gap 126 of the cavity, for instance by a wiper, and may be cured. The release material paste prevents resin material from adhering to the side wall 110 of the component 108 to be exposed. The dielectric layer on top of the component 108 as well as on top of the core 123 may be laminated from an upper side. The said dielectric layer may be made of ordinary prepreg, no-flow prepreg or low-flow prepreg. Filling of the mentioned gap 126 during lamination is here prevented by the presence of the sacrificial material 128, regardless of the prepreg type used. The temporary carrier may then be removed and a further lamination procedure may be carried out at a bottom side (for instance using a further prepreg foil and a further copper foil).

The gap 126 filled with the sacrificial material 128 can then be opened by laser cutting using laser cutting tool 125, and the release material paste material may be stripped. By stripping the release material paste, side wall 110 is exposed. Since the sacrificial material 128 may be easily removed out of the gap 126 after the laser cutting, the side wall 110 of the component 108 is exposed and is in particular free of resin after the exposing procedure.

Figure 3:
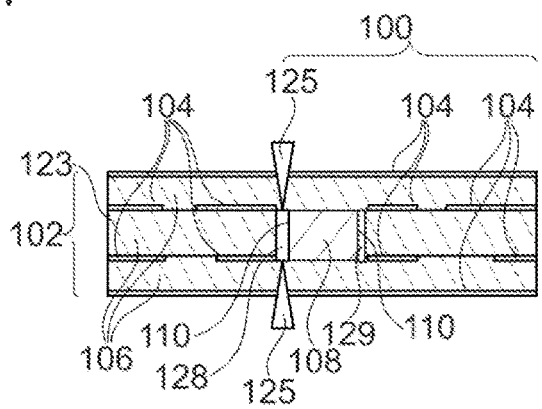

FIG. 3 illustrates a cross-sectional view of a pre-form of a component carrier 100 manufactured according to still another exemplary embodiment.

The embodiment according to FIG. 3 differs from the embodiment according to FIG. 2 in particular in that two different cavities are formed, i.e., firstly a cavity for sacrificial material 128 (such as release layer material) only, and after supply and curing of the sacrificial material 128, a second cavity overlapping with the first cavity and being configured for mounting a component 108 therein can be formed.

More specifically, the component carrier 100 manufactured according to FIG. 3 can be obtained by firstly cutting first cavities in core 123 as accommodation volumes for sacrificial material 128. Thereafter, a first temporary carrier (for instance a sticky tape) may be placed on a bottom surface of the core 123 for closing the first cavities from a bottom side. Thereafter, the sacrificial material 128 may be supplied to the first cavities and on the temporary carrier, for instance by a wiper. The sacrificial material 128 may then be cured. The temporary carrier may then be removed. Second cavities may then be cut in core 123 overlapping with the first cavities as accommodation volumes for components 108. A further temporary carrier (for instance a further sticky tape) may be placed on a bottom surface of the core 123 with the sacrificial material 128 for closing the second cavities from a bottom side. Thereafter, the components 108 may be placed in the second cavities juxtaposed to the cured sacrificial material 128. A lamination procedure may be carried out (for instance using a prepreg foil and a copper foil) at a surface of the structure facing away from the second temporary carrier. The second temporary carrier may then be removed. A further lamination procedure may be carried out (for instance using a further prepreg foil and a further copper foil).

The gap 126 filled with the sacrificial material 128 can then be opened by laser cutting using laser cutting tool 125, and the release material paste material may be stripped. By stripping the release material paste, a hollow space is formed on the left-hand side of the component 108 according to FIG. 3, thereby exposing side wall 110. Since the sacrificial material 128 may be easily removed out of the gap 126 after the laser cutting, the side wall 110 of the component 108 is free of resin after the exposing procedure.

Although not shown in the figures, the release material paste constituting the sacrificial material 128 according to FIG. 2 and FIG. 3 may be substituted by other sacrificial material 128 being selectively removable with regard to material of the components 108. For instance, a water-soluble material may be used as sacrificial material 128, for instance a salt or an appropriate polymer (for instance polyvinyl alcohol). The sacrificial material 128 may be removed to thereby expose the side wall 110 of the components 108 by supply of water.

Figure 6:
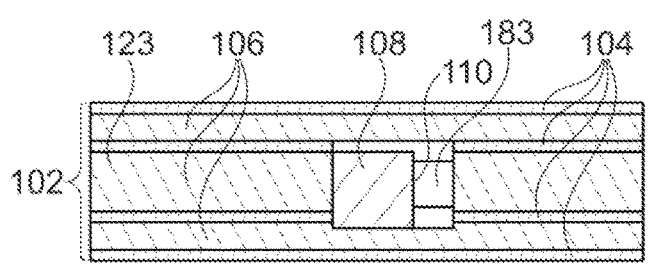
Figure 7:
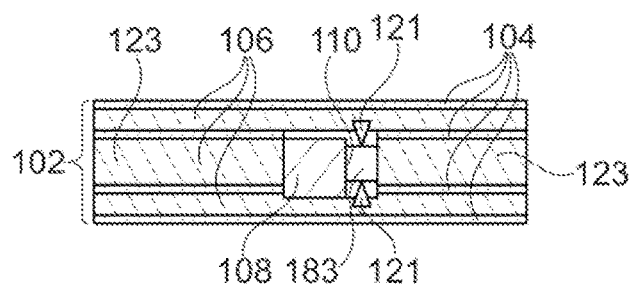
Figure 8:
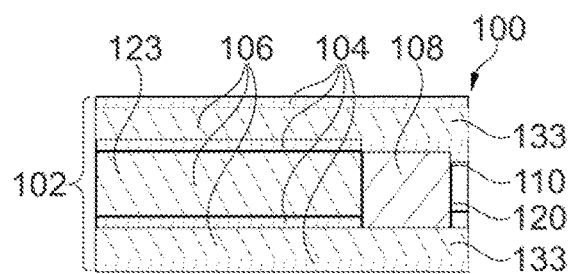

FIG. 4 to FIG. 8 illustrate cross-sectional views of structures obtained during manufacturing a component carrier 100, shown in FIG. 8, according to an exemplary embodiment. This embodiment is similar to the embodiment of the component carrier 100 of FIG. 1.

Figure 4:
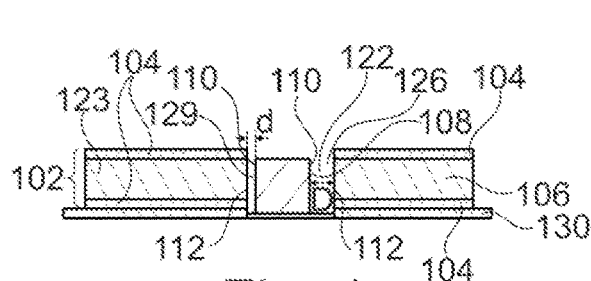
FIG. 4, FIG. 5, FIG. 6, FIG. 7, and FIG. 8 illustrate cross-sectional views of structures obtained during manufacturing a component carrier, shown in FIG. 8, according to an exemplary embodiment.

Referring to FIG. 4, a stack 102 of a core 123 of fully cured resin with reinforcing particles (for instance FR4) as electrically insulating layer structure 106 covered on both opposing main surfaces thereof with a respective one of two electrically conductive layer structures 104 (here embodied as copper foils) is shown. An accommodation cavity 122 is formed as a through hole through the stack 102. The stack 102 is arranged on a temporary carrier 130, such as a sticky tape, so that an open bottom of the accommodation cavity 122 is closed by a portion of the temporary carrier 130. Thereafter, a component 108 (such as a laser diode for emitting electromagnetic radiation, a photodiode for detecting electromagnetic radiation, or a sensor such as a chemo sensor) may be inserted into the accommodation cavity 122 of the stack 102 and may be attached to a surface of the temporary carrier 130. As can be taken from FIG. 4, the component 108 is placed asymmetrically in the accommodation cavity 122 in a lateral direction so that a gap 126 between a side wall 110 of the component 108 and an accommodation cavity delimiting side wall 112 of the stack 102 on the right-hand side has a width, D, being larger than another gap 129 between another side wall 110 of the component 108 and another accommodation cavity delimiting side wall 112 of the stack 102 on the left-hand side which has a width, d (where d<D). For instance, the size D may be 500 μm, whereas the size d may be 75 μm.

Figure 5:
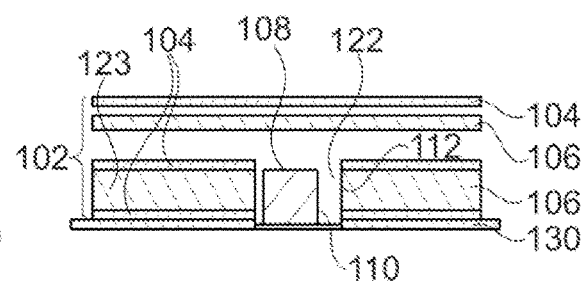

Referring to FIG. 5, a further electrically insulating layer structure 106 (here embodied as a prepreg sheet made of low-flow material or no-flow material) and a further electrically conductive layer structure 104 (here embodied as a further copper foil) are attached to an upper main surface of the structure shown in FIG. 4, i.e., to a surface facing away from the temporary carrier 130. The low-flow prepreg or no-flow prepreg of which the said electrically insulating layer structure 106 is made ensures that substantially no resin re-melts and flows into the gap 126 during a lamination procedure. Thus, the two additionally applied layer structures 106, 104 may be connected with the structure shown in FIG. 4 by lamination, i.e., the application of pressure and heat, without the risk that resin flows into gap 126 and covers side wall 110 of component 108 there. As a result, in particular the gap 126 remains open even during lamination due to the use of low-flow prepreg or no-flow prepreg, which significantly simplifies exposing side wall 110 of the component 108 later (see FIG. 8).

Referring to FIG. 6, a structure is shown which is obtained by firstly removing the temporary carrier 130 of FIG. 5 after the described lamination procedure, and by secondly carrying out a further lamination procedure at a bottom side. More specifically, the temporary carrier 130 is no longer needed to provide mechanical support after the described first lamination procedure during which the low-flow or no-flow resin material of the further electrically insulating layer structure 106 has been hardened. Consequently, the temporary carrier 130 may be removed, for instance may be peeled off from the rest of the structure shown in FIG. 5. Thereafter, a further electrically insulating layer structure 106 (preferably made of low-flow prepreg or no-flow prepreg as well) and a further electrically conductive layer structure 104 (for example a further copper foil) may be laminated to a lower main surface of the structure shown in FIG. 5 after removal of the temporary carrier 130. Due to the use of low-flow prepreg or no-flow prepreg for the electrically insulating layer structures 106 above and beneath the component 108 and the gap 126, a hollow space 183 remains in an interior of the structure shown in FIG. 6 and allows keeping side wall 110 of component 108 free of resin material.

Referring to FIG. 7, schematically shown milling tool 121 may operate on the structure shown in FIG. 6 and may cut away a portion of the layer stack on the right-hand side of the milling tool 121 in FIG. 7 by milling through the gap 126 or hollow space 183.

Referring to FIG. 8, the material of the stack 102 on the right-hand side of milling tool 121 in FIG. 7 has been removed to thereby expose the side wall 110 of the component 108 with regard to an environment of the component carrier 100.

When the component 108 is for instance embodied as laser diode, light can be emitted via the exposed side wall 110 to the environment. When the component 108 is for instance embodied as photodiode, light impinging on the exposed side wall 110 from an environment may be detected by the component 108. When the component 108 is for instance a chemical sensor, a chemical in an environment of the exposed side wall 110 can be detected by the component 108.

As a result of the described manufacturing procedure, the PCB type plate-shaped laminated component carrier 100 according to FIG. 8 is obtained which comprises the stack 102 comprising multiple electrically conductive layer structures 104 and multiple electrically insulating layer structures 106 as well as the component 108 embedded in the stack 102. The side wall 110 of the component 108 is exposed with regard to an environment of the component carrier 100 so as to be functionally coupleable with the environment of the component carrier 100. According to FIG. 8, the exposed side wall 110 of the component 108 and a side wall 133 of the stack 102 are aligned to form a substantially continuous side wall 110 of the component carrier 100 extending substantially vertically. While one main surface 120 of the cuboid component 108 is exposed at side wall 110, the other five main surfaces of this component 108 are covered by component carrier material of the stack 102 so as to be properly mechanically and electrically secured and protected.

FIG. 9 to FIG. 12 illustrate cross-sectional views of structures obtained during manufacturing a component carrier 100 according to another exemplary embodiment. This embodiment is similar to the embodiments of the component carriers 100 of FIG. 2 and FIG. 3.

Figure 9:
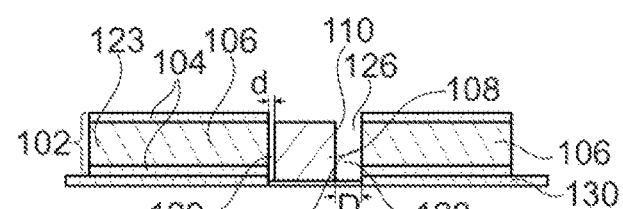
FIG. 9, FIG. 10, FIG. 11, and FIG. 12 illustrate cross-sectional views of structures obtained during manufacturing a component carrier according to another exemplary embodiment.

Referring to FIG. 9, a structure similar to that shown in FIG. 4 is formed.

Figure 10:
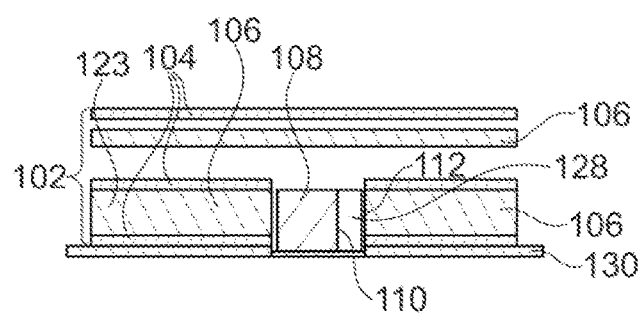

In order to obtain the structure shown in FIG. 10, the gap 126 on the right-hand side of FIG. 9 spacing the component 108 with regard to an accommodation cavity delimiting side wall 112 of the stack 102 is filled with a removable sacrificial material 128. For instance, the sacrificial material 128 may be embodied as a release structure with non-adhesive properties with regard to the material of the component 108. Such a release structure may for instance be a waxy component (which may be based on calcium stearate) or a PTFE-based material which can be applied in the form of a paste by using a wiper (not shown). The release structure may have the property to be non-adhesive with regard to both component material and component carrier material, in particular copper, epoxy resin, reinforcing glass fibers, and silicon. If desired or required, the sacrificial material 128 may be cured after insertion into gap 126, for instance by a thermal treatment, by a chemical treatment and/or by applying mechanical pressure.

After having filled the cavity 126 with the sacrificial material 128, a dielectric sheet as further electrically insulating layer structure 106 (here embodied as at least partially uncured material, for instance a prepreg sheet) and a further electrically conductive layer structure 104 (here embodied as a further copper foil) are attached to an upper main surface of the structure shown in FIG. 9, i.e., to a surface facing away from the temporary carrier 130. In particular, the "at least partially uncured material" may comprise or consist of B-stage material and/or A-stage material. By providing the layer stack with prepreg or any other B-stage material, at least a portion of the layer stack may re-melt during lamination so that resin (or the like) may flow for interconnecting the various elements and/or for closing gaps or voids and may therefore contribute to a stable intrinsic interconnection within the component carrier 100 being manufactured. Subsequently, the two additionally applied layer structures 106, 104 may be connected with the structure shown in FIG. 9 by lamination, i.e., the application of pressure and heat. While resin of the at least partially uncured material of the electrically insulating layer structure 106 may flow in gap 129 and may at least partially fill the latter during lamination, such flowable resin material will not move into gap 126 because gap 126 has already been filled by the sacrificial material 128. This advantageously also keeps the side wall 110 of the component 108 covered by sacrificial material 128 free of resin material.

Figure 11:
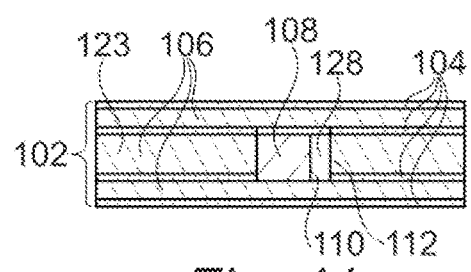

Referring to FIG. 11, a structure is shown which is obtained by firstly removing the temporary carrier 130 of FIG. 9 after the described lamination procedure, and by secondly carrying out a further lamination procedure from a bottom side. More specifically, the temporary carrier 130 is no longer needed to provide mechanical support after the described first lamination procedure during which the previously at least partially uncured material of the further electrically insulating layer structure 106 has become hardened. Secondly, a further electrically insulating layer structure 106 and a further electrically conductive layer structure 104 are laminated onto the structure shown in FIG. 10 (without temporary carrier 130) from a bottom side, to thereby obtain a symmetric configuration in a vertical direction.

Figure 12:
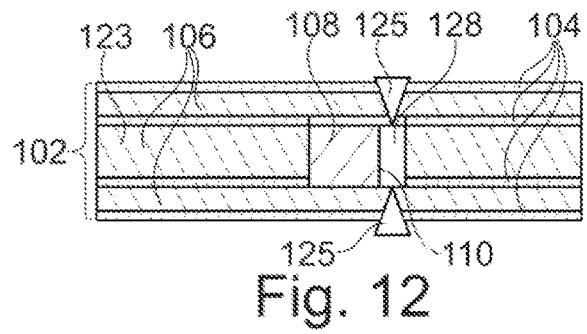

Referring to FIG. 12, a portion of the obtained structure on the right-hand side of the component 108 is then removed by laser cutting, as indicated schematically by reference numeral 125. A laser cutting line is oriented to extend vertically through the sacrificial material 128. Advantageously, the laser process has a relatively high tolerance or does not need to be carried out with high spatial accuracy, since the relatively large width, D, of the gap 126 filled with the sacrificial material 128 defines the allowed tolerance.

The result of the laser cutting procedure will be a component carrier 100 having substantially an appearance as shown in FIG. 8. In order to obtain such a component carrier 100, the sacrificial material 128 exposed after laser cutting is removed (for instance by stripping) to thereby expose the side wall 110. Such a removal process is very simple due to the intentionally poor adhesion between the sacrificial material 126 on the one hand and the component 108 and component carrier material 102 on the other hand.

In another embodiment, the procedure described referring to FIG. 9 to FIG. 12 may be carried out in a corresponding way, however substituting the release paste material by other material for sacrificial structure 128, preferably a water-soluble material such as a salt. When arriving at a structure corresponding to FIG. 12, this water-soluble material may be removed by supplying water, to thereby expose side wall 110 of component 108.

Figure 13:
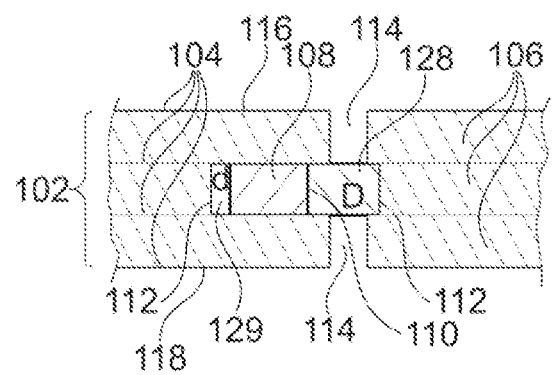
FIG. 13 and FIG. 14 illustrate a cross-sectional view and a plan view of a component carrier according to another exemplary embodiment.
Figure 14:
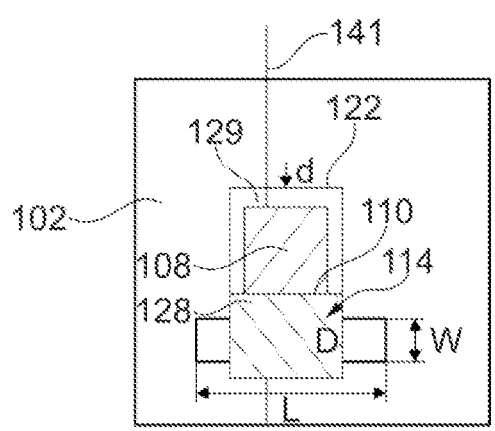

FIG. 13 and FIG. 14 illustrate a cross-sectional view and a plan view of a component carrier 100 according to an exemplary embodiment. FIG. 14 shows a cutting line 141 along which the illustration of FIG. 14 is to be cut to arrive at the cross-sectional view of FIG. 13. According to FIG. 13 and FIG. 14, a slit-shaped access recess 114 contributing to exposing the side wall 110 extends from upper main surface 116 of the component carrier 100 to be manufactured up to a lower main surface 118 thereof. As can be taken from FIG. 14, the slit has a length L being larger than a width W thereof. The length L direction corresponds to a direction extending parallel to the side wall 110 of the component 108, whereas the width W direction corresponds to a direction extending perpendicular to the side wall 110 of the component 108. In the shown embodiment, the access recess 114 is configured as a through-hole extending through the entire stack 102. According to FIG. 13 and FIG. 14, sacrificial material 128 is again foreseen as a selectively removable spacer between side wall 110 of component 108 and cavity delimiting side wall 112 of stack 102. However, in other embodiments in which a side wall 110 of component 108 is selectively exposed by a slit cut, the sacrificial material 128 may also be omitted (as in FIG. 1, FIG. 4 to FIG. 8). When sacrificial material 128 is however foreseen, the sacrificial material 128 may be removed selectively after having formed the slit-shaped access recess 114 (for instance by directing water through the slit-shaped access recess 114 for removing water-soluble sacrificial material 128). It is also possible that at least part of the sacrificial material 128 is already removed during slit formation. In order to relax the accuracy requirements for forming the slit-shaped access recess 114 (for instance by milling or laser cutting), it is possible also according to FIG. 13 and FIG. 14 that the component 108 is arranged laterally asymmetrically in accommodation cavity 122 of the stack 102 with different distances d<D with regard to opposing accommodation cavity delimiting side walls 112 of the stack 102. The distance, D, at the side where the formation of the slit-shaped access recess 114 occurs is preferably larger than the distance, d, on the other side.

Figure 15:
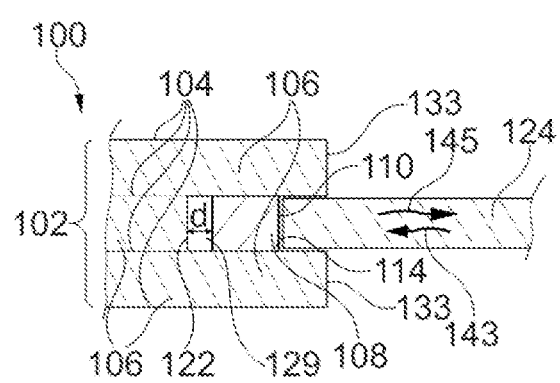
FIG. 15 illustrates a cross-sectional view of a component carrier according to another exemplary embodiment.

FIG. 15 illustrates a cross-sectional view of a component carrier 100 according to another exemplary embodiment. According to the embodiment of FIG. 15, a lateral access recess 114 extending into the stack 102 and exposing the side wall 110 of component 108 extends from a lateral side wall 133 of the stack 102 up to the side wall 110 of the component 108. In FIG. 15, the access recess 114 is configured as a blind hole.

According to FIG. 15, a further component 124, which is here configured as a light guide or optical fiber, is inserted into the blind hole type access recess 114. When the component 108 is for instance embodied as a light detecting element (for instance a photodiode), electromagnetic radiation 143 propagating along the component 124 up to the exposed side wall 110 of the component 108 can be detected by component 108. When the component 108 is however embodied as a light emitting element (for instance a laser diode), electromagnetic radiation 145 can be injected into the optical fiber for propagation along the component 124 via the exposed side wall 110 of the component 108. Thus, the component carrier 100 of FIG. 15 may for instance be used for optoelectronic data transmission.

Figure 16:
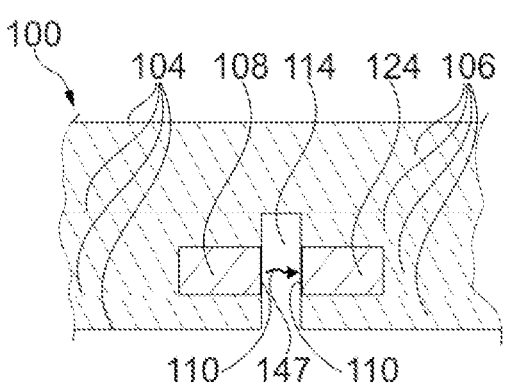
FIG. 16 illustrates a cross-sectional view of a component carrier according to still another exemplary embodiment.

FIG. 16 illustrates a cross-sectional view of a component carrier 100 according to still another exemplary embodiment. According to FIG. 16, slit-shaped access recess 114 is embodied as a blind hole exposing two opposing side walls 110 of a component 108 and a further component 124 both embedded in the same component carrier 100. Recess 114 spaces components 108, 124 and simultaneously enables wireless data communication by transmission of electromagnetic radiation 147 (such as infrared radiation, optical light, radiofrequency (RF) radiation, etc.) between the exposed side walls 110 of the components 108, 124 via an air gap provided by access recess 114. Thus, the component 108 and the further component 124 being both embedded in the stack 102 are communicatively coupled for wireless data communication via the access recess 114. For instance the component 108 may be an electromagnetic radiation emitter and the further component 124 may be an electromagnetic radiation detector.

In contrast to FIG. 1 to FIG. 3, the side walls 110 of the components 108, 124 are mutually exposed in an interior of the component carrier 100 so that the side walls 110 form part of an interior (rather than exterior) lateral side wall of the component carrier 100.

FIG. 17 to FIG. 20 illustrate cross-sectional views of structures obtained during manufacturing a component carrier 100 according to another exemplary embodiment.

Figure 17:
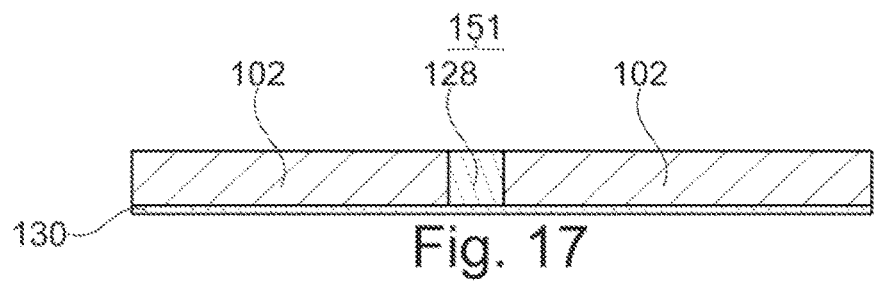
FIG. 17, FIG. 18, FIG. 19, and FIG. 20 illustrate cross-sectional views of structures obtained during manufacturing a component carrier according to another exemplary embodiment.

A structure shown in FIG. 17 is obtained by forming a first cavity portion 151 in stack 102, for instance as a through hole in a fully cured core. A temporary carrier 130, such as a sticky tape, is attached to a lower main surface of the stack 102 and closes the through hole at the bottom side. Subsequently, the first cavity portion 151 is filled with sacrificial material 128 such as release material. If desired or required, the sacrificial material 128 may then be cured. Thereafter, temporary carrier 130 may be removed.

Figure 18:
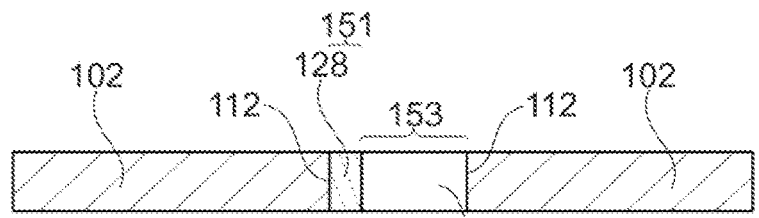

A structure shown in FIG. 18 is obtained by subsequently forming a second cavity portion 153 as a further through hole in the structure according to FIG. 17 without temporary carrier 130. The second cavity portion 153 is formed so as to laterally overlap with the first cavity portion 151. As a result, part of the sacrificial material 128 is removed when forming the second cavity portion 153.

Figure 19:
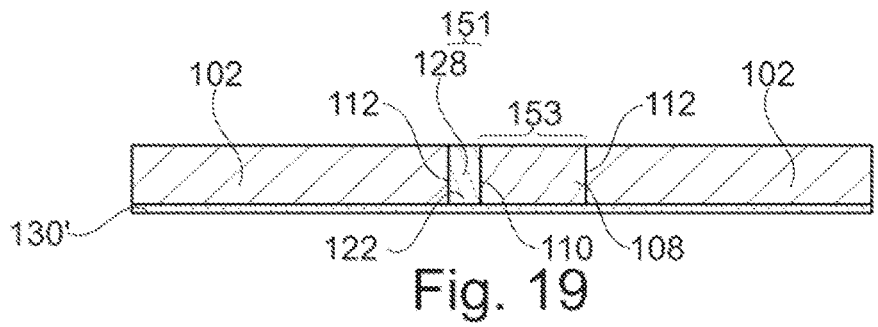

A structure shown in FIG. 19 is obtained by connecting a further temporary carrier 130' to a lower main surface of the stack 102, to a lower main surface of the remaining sacrificial material 128 and to close a bottom of the through hole constituting the second cavity portion 153. Thereafter, component 108 is inserted into the second cavity portion 153 so that the first cavity portion 151 filled with the sacrificial material 128 and the second cavity portion 153 accommodating the component 108 together constitute a common accommodation cavity 122 for accommodating the component 108 and the sacrificial material 128.

Figure 20:
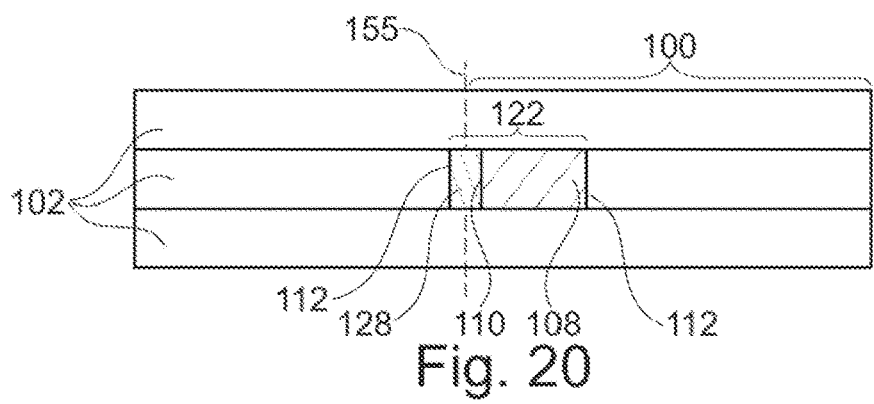

A structure shown in FIG. 20 is obtained by laminating a further portion of stack 102 onto an upper main surface of the structure shown in FIG. 19. Thereafter, the further temporary carrier 130' may be removed from a bottom surface of the obtained structure. After this, yet another portion of stack 102 can be laminated on a lower main surface of the obtained structure. As indicated by a separation line 155, the obtained structure may be separated then by a vertical cut, which can for instance be accomplished by a laser treatment or mechanically. After removing the remaining portion of the sacrificial material 128, the side wall 110 of component 108 is exposed and a component carrier 100 according to an exemplary embodiment is obtained.

The embodiment of FIG. 17 to FIG. 20 has the advantage that there is substantially no limitation concerning the horizontal width of the first cavity portion 151 which simplifies the supply of the sacrificial material 128 into the first cavity portion 151.

Figure 21:
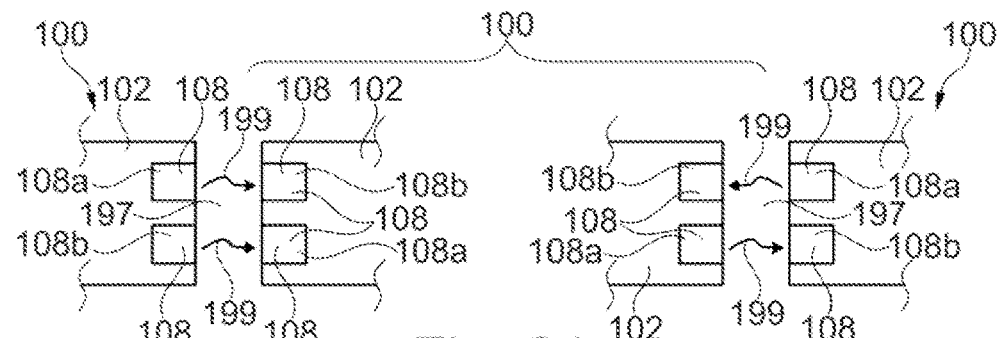
FIG. 21 illustrates a cross-sectional view of three component carriers arranged side by side according to another exemplary embodiment.

FIG. 21 illustrates a cross-sectional view of three component carriers 100 spaced side-by-side according to another exemplary embodiment.

In the embodiment of FIG. 21, the juxtaposed component carriers 100 are spaced with regard to each other by respective gaps 197. Lateral surface portions of multiple embedded components 108 of the component carriers 100 are exposed. As can be taken from FIG. 21, each of the shown component carriers 100 comprises, as respective component 108, at least one sender 108a and at least one receiver 108b.

By arranging the component carriers 100 one next to the other with mutually aligned sender 108a of one component carrier 100 emitting electromagnetic radiation 199 and receiver 100b of another component carrier 100 receiving the electromagnetic radiation 199, the arrangement according to FIG. 21 is appropriate for applications such as Near Field Communication (NFC). A communication according to another communication protocol is possible. For instance, the communication may be accomplished by infrared communication, Bluetooth®, etc. The component carrier 100 being arranged, according to FIG. 21, in the middle between the other two component carriers 100 has a respective pair of sender 108a and receiver 108b on each of the two opposing main surfaces thereof. Thus, the component carrier 100 in the middle sandwiched by the other two component carriers 100 may communicate with both other component carriers 100. Bluetooth® is a registered trademark of Bluetooth Sig, Inc. of Kirkland, Washington, U.S.A.

Figure 22:
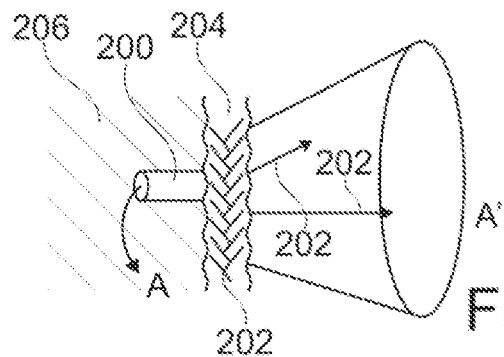
FIG. 22 illustrates an example showing a light-emitting diode emitting light through transparent material.

FIG. 22 illustrates an example showing a light-emitting diode 200 emitting light 202 through optically transparent material 204.

According to FIG. 22, the light-emitting diode 200 is encapsulated in an encapsulant 206 and emits the light 202 with a cross-sectional area A into the transparent material 204. Due to a rough surface of the transparent material 204, light diffraction occurs which increases the cross-sectional area A' of the light leaving the transparent material 204 at an air interface. This undesired phenomenon is promoted by the pronounced surface roughness of the transparent material 204.

Figure 23:
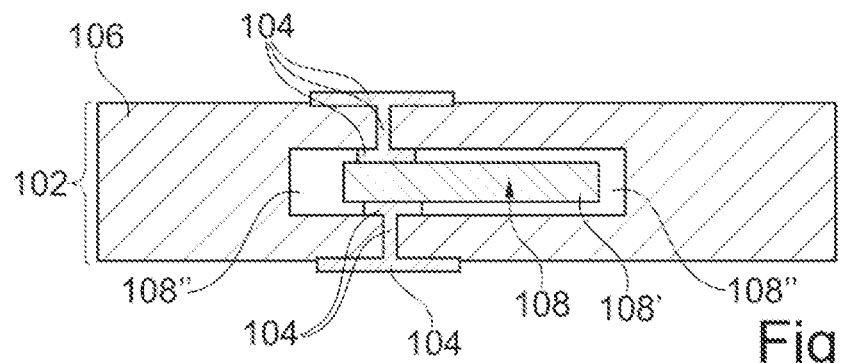
FIG. 23, FIG. 24, and FIG. 25 show different structures obtained during manufacturing a component carrier according to an exemplary embodiment which is shown, in operation, in FIG. 26.
Figure 24:
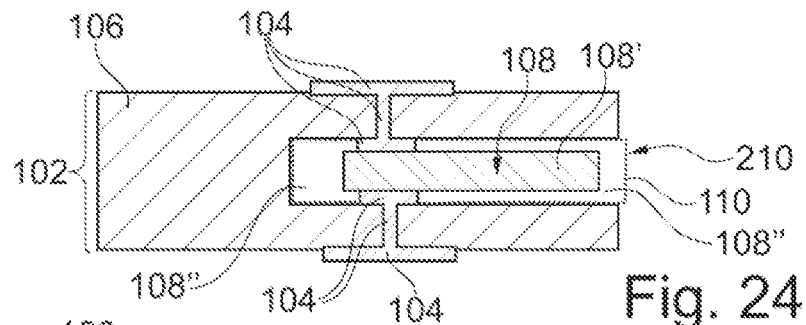
Figure 25:
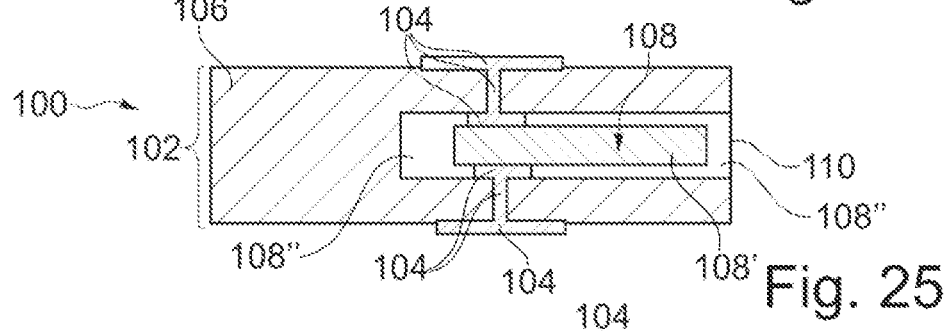
Figure 26:
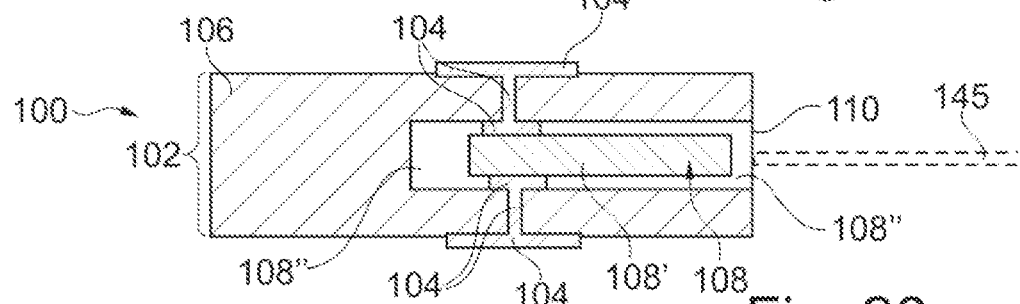

FIG. 23 to FIG. 25 show different structures obtained during manufacturing a component carrier 100 according to an exemplary embodiment which is shown, in operation, in FIG. 26.

Referring to FIG. 23, a component 108 is embedded in a stack 102 composed of electrically conductive layer structures 104 as well as electrically insulating layer structures 106. In the shown embodiment, the component 108 comprises an electromagnetic radiation emitting member 108' (such as a light-emitting diode, for instance embodied as laser die) configured for emitting light as electromagnetic radiation 145. The electromagnetic radiation emitting member 108' is electrically coupled with the electrically conductive layer structures 104. The electromagnetic radiation emitting member 108' is circumferentially covered by a transparent material 108". The transparent material 108" is preferably a fiber free resin which does not disturb propagation of electromagnetic radiation 145 (compare FIG. 26) through the transparent material 108". Thus, FIG. 23 shows an embedded component 108 in a panel.

Referring to FIG. 24, material of the stack 102 is removed by a cutting procedure, as described above, to thereby expose side wall 110 of the component 108, more precisely the side wall 110 of the transparent material 108" of the component 108. During operation of the component carrier 100 being manufactured, electromagnetic radiation 145 emitted by the electromagnetic radiation emitter member 108' propagates through the transparent material 108" and leaves the component carrier 100 via the exposed side wall 110. However, as a result of the cutting procedure, the exposed side wall 110 has a pronounced surface roughness, as indicated schematically by reference numeral 210. Hence, FIG. 24 shows the result of a card cutting procedure, after which the side surface of the transparent material 108" remains rough.

Referring to FIG. 25, the exposed rough side wall 110 of the transparent material 108" is polished, for instance mechanically or chemically. Hence, the structure shown in FIG. 24 may be made subject of a lateral polishing procedure which smoothes the side wall surface of the transparent material 108" after the polishing process. As a result, the emitted electromagnetic radiation 145 propagates as a parallel narrow beam through the transparent material 108" and the side wall 110 without being substantially spatially widened, see FIG. 26.

The embodiment according to FIG. 26 has the advantage that it is possible to embed a laser diode as electromagnetic radiation emitting member 108' in the PCB type component carrier 100, and at the same time use the transparent window in the stack 102 for propagation of the laser beam as electromagnetic radiation 145. As can be taken from FIG. 26, the portion of the transparent material 108" between the side wall of the electromagnetic radiation emitting member 108' and the lateral side wall of the component carrier 100 forms part of an optical path along which the electromagnetic radiation 145 propagates. Therefore, the component carrier 100 according to FIG. 26 can be used for optical communication or projection, for example of visible light or infrared radiation, in particular embodied as laser beam. The electromagnetic radiation 145 is emitted by the component 108 or can be received and detected by the component 108. Preferably, the transparent material 108" is free of bubbles, fibers, fabrics, etc. and has absorption properties allowing light passing without significant losses. As can be taken from FIG. 26, the transparent material 108" remains in the lateral opening of the component carrier 100. Although not shown in the figure, a photodiode may be installed in the back of the laser diode. A person skilled in the art of laser technology will understand the installation of the photodiode in the build up with the methods mentioned in the above description. As an alternative to the embodiment according to FIG. 26, it is also possible to keep the lateral opening of the component carrier 100 (filled with the transparent material 108" according to FIG. 26) empty or to remove transparent material 108" out of such a lateral opening, similar as in FIG. 15.

Figure 27:
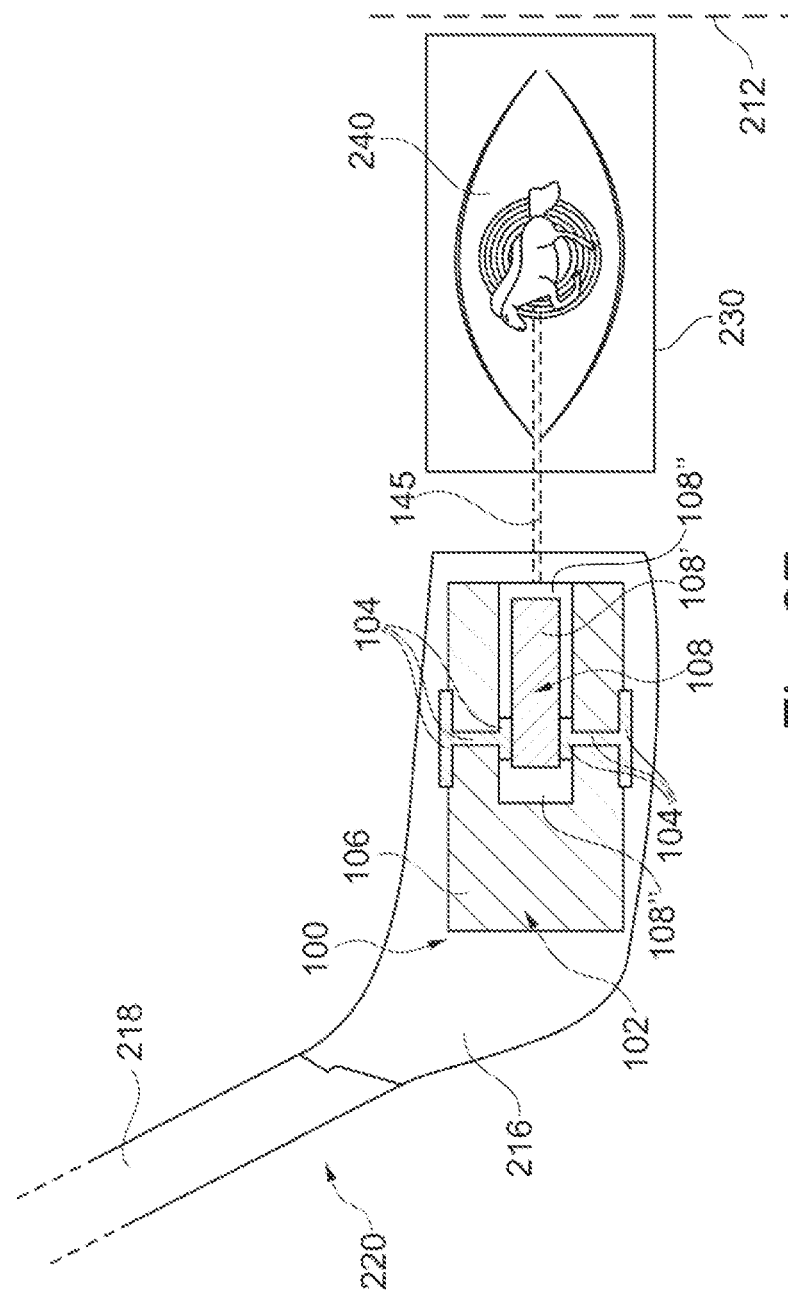
FIG. 27 illustrates spectacles according to an exemplary embodiment comprising the component carrier shown in FIG. 26.

FIG. 27 illustrates spectacles 220 according to an exemplary embodiment comprising the component carrier 100 shown in FIG. 26.

Descriptively speaking, FIG. 27 schematically illustrates a left half of the spectacles 220 (see symmetry axis 212). As can be taken from FIG. 27, the component carrier 100 according to FIG. 26 is assembled within a housing 216 which may be connected to an arm or a frame of the spectacles 220 (see reference numeral 218). As also shown in FIG. 27, the spectacles 200 additionally comprise a screen 230 onto which a user wearing the spectacles 220 looks with his eyes 240. The light transmitted as the electromagnetic radiation 145 from the electromagnetic radiation emitting member 108' of the component 108 embedded within the component carrier 100 is displayed on the screen 230 and can be seen by the user when wearing and looking through the spectacles 220. The screen 230 can have micro-actuators and micro-mirrors for means of light deflection and image formation. Colors can be formed with three lasers in red, green, and blue to form the RGB system of colors.

It should be noted that the term "comprising" does not exclude other elements or steps and the article "a" or "an" does not exclude a plurality. Also, elements described in association with different embodiments may be combined.

It should be further understood that when the phrase "at least one of A and B" is included in a claim, where the labels A and B represent a recitation of limitations or features, the phrase "at least one of A and B" means at least one of A or B. It should be further understood that "at least one of A or B" includes the limitations or features of: A alone; B alone; any positive whole number of A alone; any positive whole number of B alone; and any combination of a positive whole number of A with a positive whole number of B.

Implementation is not limited to the preferred embodiments shown in the figures and described above. Instead, a multiplicity of variants is possible which variants use the solutions shown and the principle according to embodiments of the invention even in the case of fundamentally different embodiments.

We claim:
1. A component carrier, comprising:
a stack comprising a plurality of electrically conductive layer structures and/or electrically insulating layer structures;
an optical component embedded in the stack;
wherein at least a portion of a side wall of the optical component is exposed;
an access recess formed in the stack, wherein the access recess extends from a lateral side wall of the stack to the side wall of the optical component and the access recess exposes the side wall of the optical component; and wherein the access recess is a slit-shaped recess exposing a first side wall of the optical component and a second side wall of a further component, wherein the first side wall and the second side wall oppose each other, the optical component and the further component are arranged opposite to each other, and the optical component and the further component are communicatively coupled.

2. The component carrier according to claim 1, wherein the access recess is configured as a blind hole.

3. The component carrier according to claim 1, wherein the further component is inserted in the access recess.

4. The component carrier according to claim 1, wherein the further component is an optically transparent component.

5. The component carrier according to claim 1, wherein the further component is configured as at least one of (i) a light guide and (ii) an optical fiber.

6. The component carrier according to claim 1, wherein the further component is configured as at least one of (i) a light detecting element and (ii) a light emitting element.

7. The component carrier according to claim 1, wherein the further component comprises at least one reflecting surface which is configured to diverge a light beam.

8. The component carrier according to claim 1, wherein the further component comprises at least one optical lens which is configured to change a focus of a light beam.

9. The component carrier according to claim 1, wherein the
optical component and the further component are communicatively coupled for a wireless data communication via the slit-shaped access.

10. The component carrier according to claim 1, wherein the optical component and the further component are embedded in the stack.

11. The component carrier according to claim 1, further comprising:
a transparent material arranged between the side wall of the optical component and a lateral side wall of the stack.

12. The component carrier according to claim 11, wherein the transparent material forms part of an optical path for propagating electromagnetic radiation.

13. The component carrier according to claim 11, wherein the transparent material comprises at least one of (i) a fiber free material, (ii) glass, and (iii) epoxy.

14. The component carrier according to claim 11, wherein the transparent material comprises at least one of (i) at least one reflecting surface which is configured to diverge a light beam, and (ii) at least one optical lens which is configured to change a focus of a light beam.

15. A method of manufacturing a component carrier, the method comprising:
forming a stack of a plurality of electrically conductive layer structures and/or electrically insulating layer structures;
embedding an optical component in the stack; and
subsequently removing material of the stack to thereby expose at least a portion of a side wall of the optical component with regard to an environment of the component carrier, wherein removing material of the stack comprises forming an access recess in the stack, the access recess extending from a lateral side wall of the stack to the side wall of the optical component, the access recess exposing the side wall of the optical component with regard to the environment of the component carrier.

16. The method according to claim 15, wherein removing material of the stack further comprises performing a cutting procedure of the stack.

17. The method according to claim 16, wherein the optical component is at least in part circumferentially covered by a transparent material.

18. The method according to claim 17, wherein removing material of the stack further comprises:
after performing the cutting procedure,
performing a lateral polishing procedure which smoothes a side wall surface of the transparent material.

19. A component carrier, comprising:
a stack comprising a plurality of electrically conductive layer structures and/or electrically insulating layer structures;
an optical component embedded in the stack;
wherein at least a portion of a side wall of the optical component is exposed;
an access recess formed in the stack, wherein the access recess extends from a lateral side wall of the stack to the side wall of the optical component and the access recess exposes the side wall of the optical component; and
a further component being inserted in the access recess, wherein the further component is configured as an optical fiber.

* * * * *

UNITED STATES PATENT AND TRADEMARK OFFICE
CERTIFICATE OF CORRECTION

PATENT NO. : 12,424,504 B2  
APPLICATION NO. : 18/147276  
DATED : September 23, 2025  
INVENTOR(S) : Bettina Schuster et al.

Page 1 of 1

It is certified that error appears in the above-identified patent and that said Letters Patent is hereby corrected as shown below:

On the Title Page

Item (71) delete "AT&SAustria" insert -- AT&S Austria --.

Item (30) titled Foreign Application Priority Data insert -- Aug, 4, 2017 (EP) 17185037 --.

Signed and Sealed this  
Eleventh Day of November, 2025

John A. Squires  
*Director of the United States Patent and Trademark Office*